United States Patent
Liaw

(10) Patent No.: US 8,929,130 B1
(45) Date of Patent: Jan. 6, 2015

(54) TWO-PORT SRAM CELL STRUCTURE

(71) Applicant: Taiwan Semiconductor Manufacturing Company Limited, Hsinchu (TW)

(72) Inventor: Jhon-Jhy Liaw, Hsinchu County (TW)

(73) Assignee: Taiwan Semiconductor Manufacturing Company Limited, Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/077,314

(22) Filed: Nov. 12, 2013

(51) Int. Cl.
*G11C 11/40* (2006.01)
*G11C 11/419* (2006.01)
*G11C 11/412* (2006.01)

(52) U.S. Cl.
CPC ............ *G11C 11/419* (2013.01); *G11C 11/412* (2013.01)
USPC ...... 365/156; 365/154; 365/189.03; 365/226; 365/230.05

(58) Field of Classification Search
CPC .. G11C 11/412; G11C 11/413; G11C 11/419; G11C 7/1075; G11C 8/16
USPC ................ 365/154, 156, 189.03, 230.05, 226
See application file for complete search history.

(56) References Cited

U.S. PATENT DOCUMENTS

| | | | | |
|---|---|---|---|---|
| 8,441,829 | B2 * | 5/2013 | Huang et al. | 365/49.11 |
| 2008/0117666 | A1 * | 5/2008 | Russell et al. | 365/154 |
| 2010/0259971 | A1 * | 10/2010 | Liaw | 365/154 |
| 2013/0194859 | A1 * | 8/2013 | Liaw | 365/154 |

* cited by examiner

*Primary Examiner* — Tan T. Nguyen
(74) *Attorney, Agent, or Firm* — Jones Day

(57) ABSTRACT

A memory cell is provided. The memory cell comprises a write port and a read port. The write port comprises a pair of cross-coupled inverters and a plurality of metal lines. The first inverter comprises a first pull-up device and a first pull-down device. The second inverter comprises a second pull-up device and a second pull-down device. The metal lines comprise a Vcc conductor line, a first Vss conductor line, and a second Vss conductor line. The first pull-down device has a source terminal coupled to the first Vss line. The second pull-down device has a source terminal coupled to the second Vss line. The read port comprises a cascaded device, a read word line, read bit line and a third Vss conductor line. The cascaded device comprises a read pull-down device and a read pass device. The read pull-down device has a source terminal coupled to the third Vss conductor line. The read pass device has a drain terminal coupled to the read bit line. The third Vss conductor line is coupled to a first power saving circuit. The Vcc conductor line is coupled to a second power saving circuit.

20 Claims, 12 Drawing Sheets

TWO-PORT SRAM CELL STRUCTURE

FIELD

The technology described in this patent document relates generally to semiconductor devices and more particularly to a SRAM cell structure.

BACKGROUND

Integrated circuits (ICs) may comprise one or more types of semiconductor devices such as n-channel MOSFET ("NMOS" or "NMOSFET") devices, p-channel MOSFET ("PMOS" or "PMOSFET") devices, bipolar junction transistor devices, diode devices, and capacitors devices among others. Different types of devices can present different design considerations for a semiconductor designer.

Static random access memory ("SRAM") is commonly used in electronic devices. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit line (or a pair of bit lines), which is used for reading a data bit to be stored in a selected SRAM cell or writing a data bit that has been stored in the selected SRAM cell onto the bit lines.

SUMMARY

In accordance with the teachings described herein, semiconductor devices having novel memory cell structures are provided. In one example, the semiconductor device comprises a plurality of SRAM memory arrays. Each memory array comprises a plurality of memory cells. Each memory cell comprises a write port and a read port. Each write port comprises a first pull-down device and a second pull-down device. Each read port comprises a read pull-down device and read pass device. A source terminal of the first pull-down devices is coupled to a first Vss conductor line. A source terminal of the second pull-down devices is coupled to a second Vss conductor line. A source terminal of the read pull-down devices is coupled to a third Vss conductor line. The third Vss conductor line is electrically isolated from both the first Vss conductor line and the second Vss conductor line.

These aspects and other embodiments may include one or more of the following features. The first Vss line may have a first Vss potential and the third Vss line may have a second Vss potential wherein the second Vss potential is higher than the first Vss potential during a non read cycle. The third Vss line may have a second Vss potential during a non read cycle and a third Vss potential during a read cycle wherein the second Vss potential is higher than the third Vss potential. The first Vss conductor line, the second Vss conductor line, and the third Vss conductor line may be located at a first metal layer, and a Vss strap line may be located at a second metal layer and may be coupled to one or more vias to connect the first Vss conductor line and the second Vss conductor line. Each memory cell may further comprise a first and second pull-up device wherein each of the first and second pull-up devices, the first and second pull-down devices, and the read port pull-down device comprises a FinFet transistor, wherein the first and second pull-down devices have more fins than the first and second pull-up devices, and wherein the read port pull-down devices have more fins than the first and second pull-down devices. The read port pull-down devices may have three fins, the first and second pull-down devices may have two fins, and the first and second pull-up devices may have one fin.

In another example, a memory cell is provided. The memory cell comprises a write port and a read port. The write port comprises a pair of cross-coupled inverters and a plurality of metal lines. The first inverter comprises a first pull-up device and a first pull-down device. The second inverter comprises a second pull-up device and a second pull-down device. The metal lines comprise a Vcc conductor line, a first Vss conductor line, and a second Vss conductor line. The first pull-down device has a source terminal coupled to the first Vss line. The second pull-down device has a source terminal coupled to the second Vss line. The read port comprises a cascaded device, a read word line, a read bit line and a third Vss conductor line. The cascaded device comprises a read pull-down device and a read pass device. The read pull-down device has a source terminal coupled to the third read bit line. The read pass device has a drain terminal coupled to the Vcc conductor line. The third Vss conductor line is coupled to a first power saving circuit. The Vcc conductor line is coupled to a second power saving circuit.

These aspects and other embodiments may include one or more of the following features. The third Vss conductor line may be electrically isolated from the first Vss line and the second Vss line. The Vss line has a first Vss potential, the third Vss line has a second Vss potential, and the second Vss potential may be higher than first Vss potential during a non read cycle. The third Vss line may have a second Vss potential during a non read cycle and a third Vss potential during a read cycle, wherein the second Vss potential is higher than the third Vss potential. The first power saving circuit may be configured to provide a negative voltage pulse to the third Vss line during a read cycle to drive the voltage on the third Vss line lower than the voltage on the first Vss line. The Vcc line may have a first Vcc potential and a second Vcc potential that is selected by the second power saving circuit, wherein the first Vcc potential is selected when the read word line is selected, the second Vcc potential is selected when the read word line is not selected, and wherein the first Vcc potential is higher than the second Vcc potential. The first power saving circuit may comprise a first NMOSFET having a gate node and a drain node that are electrically connected to the third Vss line and having a source node that is electrically connected to a fourth Vss line. The first power saving circuit may further comprise a second NMOSFET having a drain node that is electrically connected to the third Vss line, a source node that is electrically connected to the fourth Vss line, and a gate node that is controlled by an enable signal. The enable signal may be configured to turn on the second NMOSFET when the read word line is selected and may be configured to turn off the second NMOSFET when the read word line is not selected. The second power saving circuit may comprise a first NMOSFET having a drain node that is electrically connected to a Vdd line, a source node that is electrically connected to the Vcc line, and a gate node that is controlled by a predetermined voltage. The second power saving circuit may further comprise a first PMOSFET having a drain node that is electrically connected to the Vcc line, a source node that is electrically connected to the Vdd line, and a gate node that is controlled by a read word line signal. The second power saving circuit may comprise a first NMOSFET having a drain node and a gate node that are electrically connected to a Vdd line and a source node that is electrically connected to the Vcc line. The second power saving circuit may further comprise a first PMOSFET having a drain node that is electrically connected to the Vcc line, a source node that is electrically connected to the Vdd line, and a gate node that is controlled by an enable signal.

In another example, a static random access memory (SRAM) comprising a plurality of memory arrays is provided. Each memory array comprises a plurality of memory cells. A first memory array of the plurality of memory arrays comprises a plurality of first memory cells. Each first memory cell comprises a write port and a read port. Each write port comprises two pass gate devices, a first pull-down device and a second pull-down device, a first pull-up device and a second pull-up device, and write port metal lines. The write port metal lines comprise a first Vcc line, a first Vss line, a second Vss line, a first write bit line, a first write bit complement line, and a first write word line. Each read port comprises a read pull-down device, a read pass gate, and read port metal lines. The read port metal lines comprise a third Vss line, a read bit line and a write word line. The metal conductors of the first Vss line, the second Vss line, and the third Vss line are located at the same metal layer and follow the same routing direction. The third Vss line is electrically isolated from the first and second Vss line. The devices in the first memory cells comprise FinFET transistors. The first pull-down and second pull-down devices comprise more fins than the first pull-up and second pull-up devices. The read pull-down device comprises more fins than the first pull-down and second pull-down devices.

These aspects and other embodiments may include one or more of the following features. The first pull-up and second pull-up devices may each comprise a single fin transistor, the first pull-down and second pull-down devices may each comprise a two fin transistor, and the read pull-down device may comprise a more than two fin transistor. The third Vss line may be connected to a power saving circuit that is configured to selectively apply a first Vss potential and a second Vss potential to the Vss line. The first Vss potential may be selected when the read word line is selected, the second Vss potential may be selected when the read word line is not selected, and the first Vss potential is lower than the second Vss potential. The third Vss line may be connected to a power saving circuit that is configured to selectively apply a first Vss potential and a second Vss potential to the Vss line. The first Vss potential may be selected when the read word line is selected, the second Vss potential may be selected when the read word line is not selected, and the first Vss potential is lower than the potential on the first Vss line.

DETAILED DESCRIPTION

Speed and power consumption considerations may require the use of different design techniques. In the data storage and write port portion of a memory cell, it may be desirable for memory cell devices to have a higher threshold voltage ("Vt") for both cell stability and standby leakage reduction. In the read port portion, a lower Vt setting may be desired for cell current boost, but this may result in a high leakage due to higher subthreshold leakage. Power save circuits may be used to reduce the read-port leakage when the memory cells are not in use.

Figure 1:
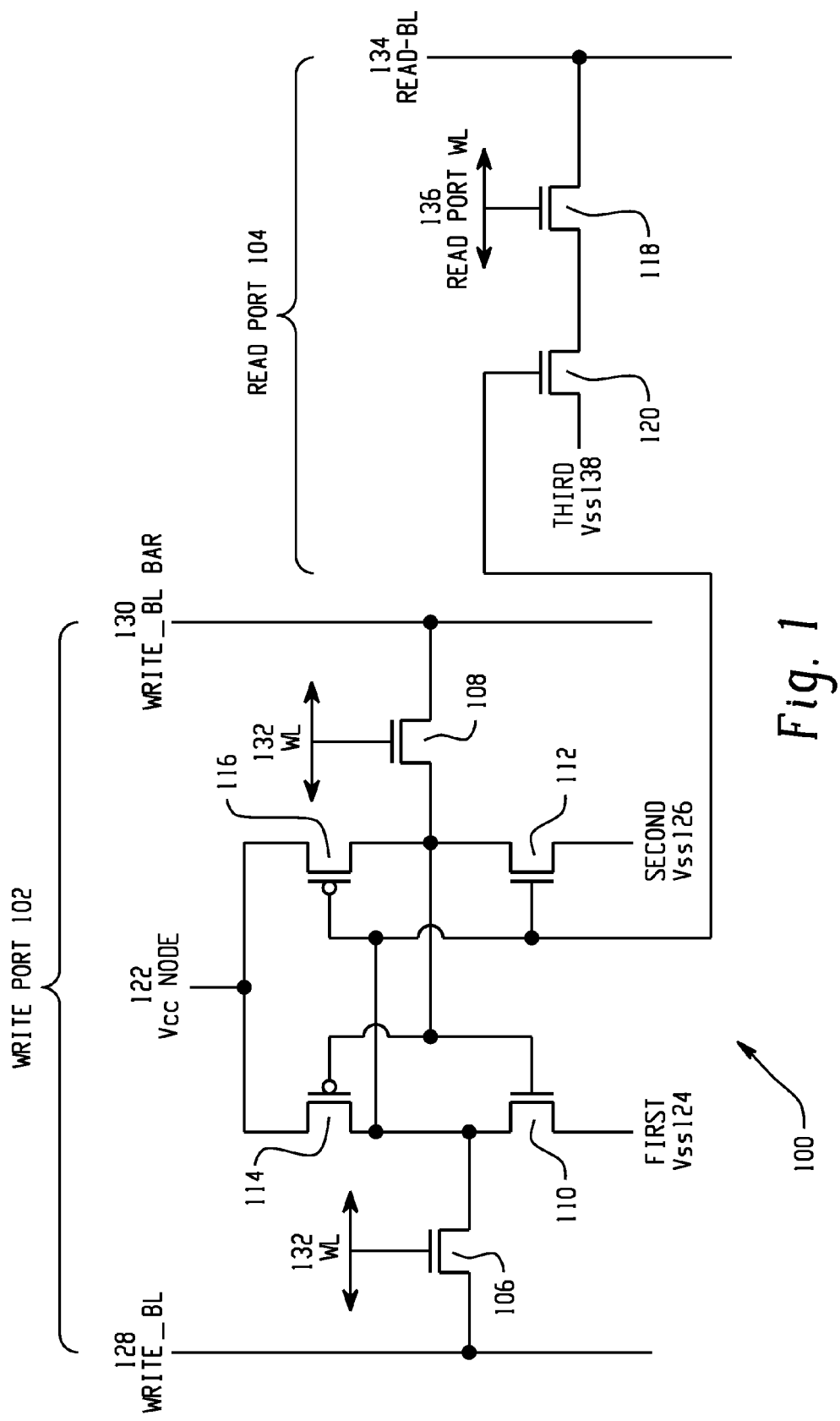
FIG. 1 is a schematic diagram of an example two-port SRAM cell circuit.

Depicted in FIG. 1 is a schematic diagram of an example two-port SRAM cell circuit 100. The example cell circuit 100 comprises a write port section 102 and a read port section 104. The write port section 102 comprises two pass gates—first pass gate 106 and second pass gate 108 (NMOS transistors in this example), two pull down devices—first pull-down device 110 and second pull-down device 112 (NMOS transistors in this example), and two pull up devices—first pull-up device 114 and second pull-up device 116 (PMOS transistors in this example). The read port section 104 comprises two cascaded devices: a read port pass device 118 (a NMOS transistor in this example) and a read port pull down device 120 (a NMOS transistor in this example).

The drain nodes of first pull-down device 110 and first pull-up device 114 are electrically connected together. The gate nodes of first pull-down device 110 and first pull-up device 114 are electrically connected together and electrically connected to the drain nodes of second pull-down device 112 and second pull-up device 116. The drain nodes of second pull-down device 112 and second pull-up device 116 are electrically connected. The gate nodes of second pull-down device 112 and second pull-up device 116 are electrically connected together and electrically connected to the drain nodes of first pull-down device 110 and first pull-up device 114.

The source nodes of pull-up devices 114, 116 are electrically connected a first Vcc power line 122. The source node of first pull-down device 110 is electrically connected to a first Vss power line 124. The source node of second pull-down device 112 is electrically connected to a second Vss power line 126.

The drain node of first pass gate 106 is electrically connected to write bit line ("BL") 128, and the drain node of second pass gate 108 is electrically connected to write complement BL 130. The gate nodes of first pass gate 106 and second pass gate 108 are electrically connected to write word line ("WL") 132. The source node of first pass gate 106 is electrically connected to the drain node of first pull-down device 110. The source node of second pass gate 108 is electrically connected to the drain node of second pull-down device 112.

The drain node of read port pass device 118 is electrically connected to read BL 134. The gate node of read port pass device 118 is electrically connected to read WL 136. The source node of read port pass device 118 is electrically connected to the drain node of read port pull down device 120. The gate node of read port pull down device 120 is connected to the gate of second pull-down device 112. The source node of read port pull down device 120 is electrically connected to a third Vss power line 138.

In operation, first pull-up device 114 and first pull-down device 110 operate as a first inverter that is cross-coupled with a second inverter made up of second pull-down device 116 and second pull-up device 112. The first and second inverters operate as a latch to store data in a memory cell. The first pass gate 106 and second pass gate 108 in the write port 102 operate to allow data from the memory cell to be written to write BL 128 and write complement BL 130. The read port functions to allow data on read BL 134 to be stored in the memory cell.

Figure 2:
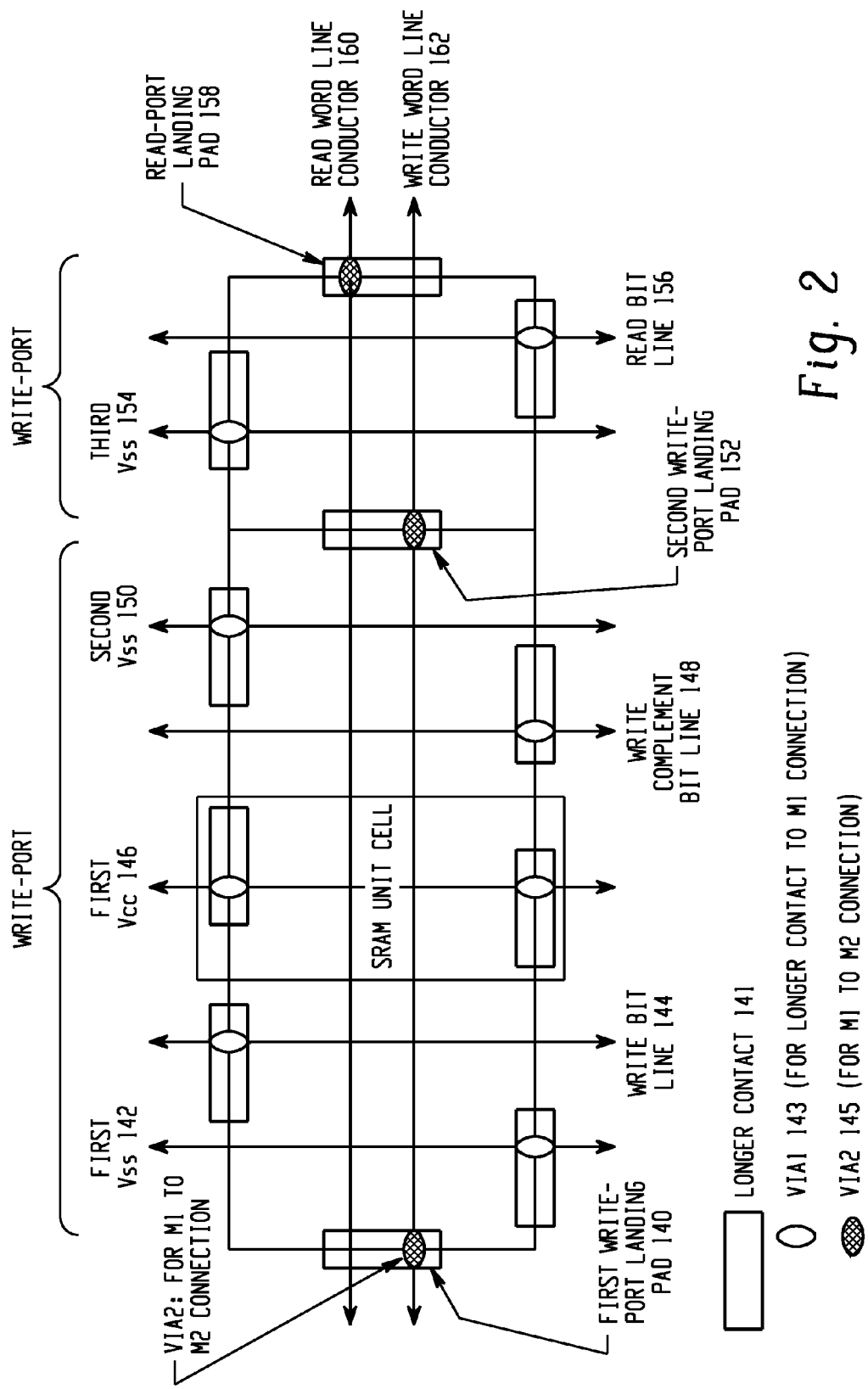
FIG. 2 is a schematic diagram illustrating the metal structure for the example two-port SRAM unit cell of FIG. 1.

Depicted in FIG. 2 is a schematic diagram illustrating the metal structure for the example two-port SRAM unit cell of FIG. 1. In particular, the figure illustrates a first-level metal layer comprising a first write-port landing pad 140, a first Vss line 142, a write bit line 144, a first Vcc line 146, a write complement bit line 148, a second Vss line 150, a second landing pad 152, a third Vss line 154, a read bit line 156 and a read-port landing pad 158. Also illustrated are a second-level metal layer comprising a read word line conductor 160 and a write word line conductor 162. Longer contact 141, via1 143 (for longer contact to M1 connection) and via2 145 (for M1 to M2 connection) are also illustrated. The metal conductors of said first Vss line 142, second Vss line 150, third Vss line 154, first Vcc line 146, first write bit line 144, first write complement bit line 148, and first read bit line 156 are located at first level metal layer and all follow a first routing direction.

Figure 3:
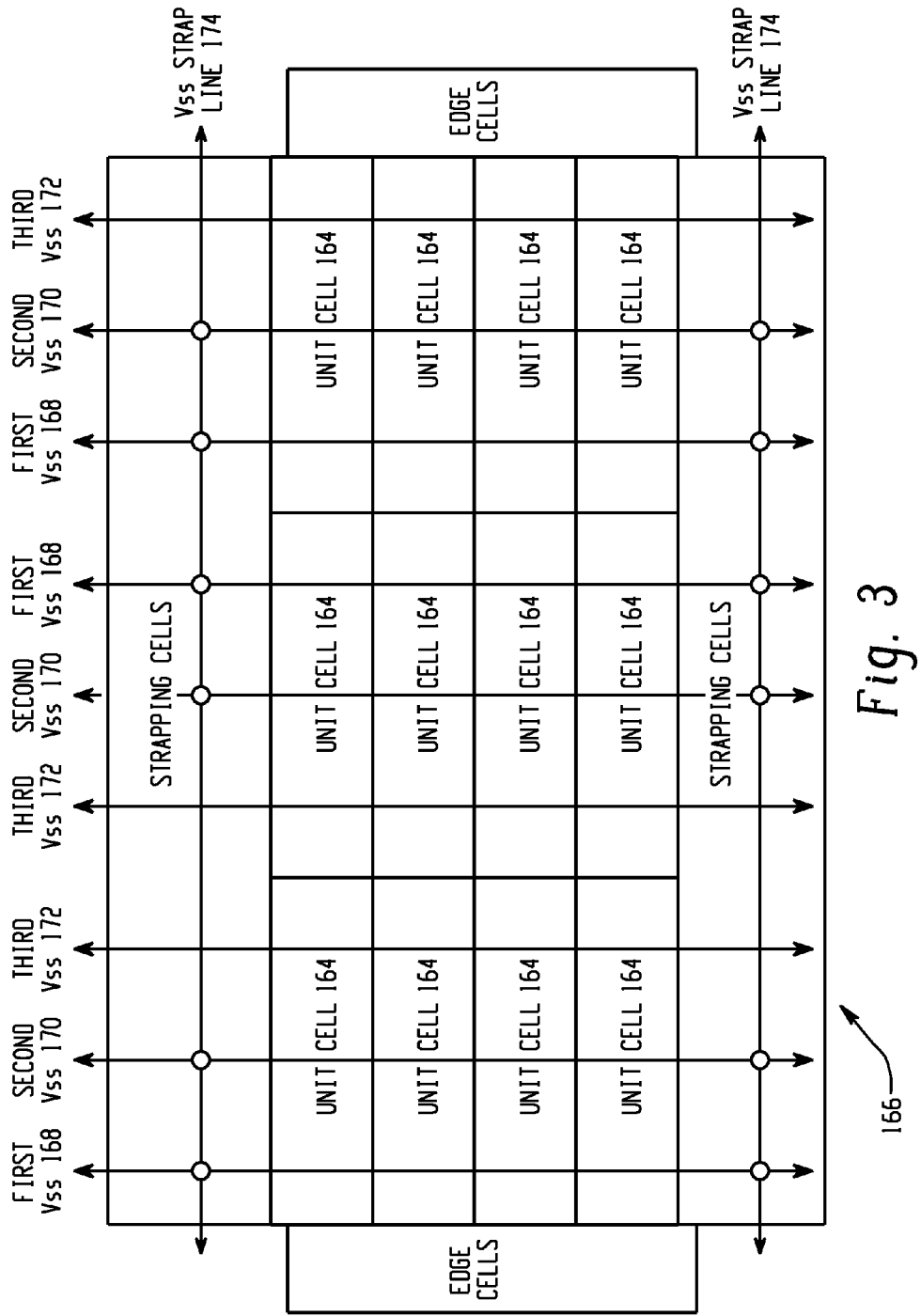
FIG. 3 is a schematic diagram illustrating an example two-port SRAM cell array metal structure.

Depicted in FIG. 3 is a schematic diagram illustrating an example two-port SRAM cell array metal structure. In particular, the figure shows a plurality of memory cells (unit cell 164) that combine to form a memory array 166 and a set of metal conductors comprising a first Vss line 168, a second Vss line 170, and a third Vss line 172. The example memory array also comprises strapping cells. The strapping cells include a Vss strap line 174 that is located at the second level metal layer. The first Vss line 168 and the second Vss line 170 are electrically connected together by using the Vss strap line 174 and vias. The third Vss line 172, however, is electrically isolated from both the first Vss line 168 and the second Vss line 170.

Figure 4A:
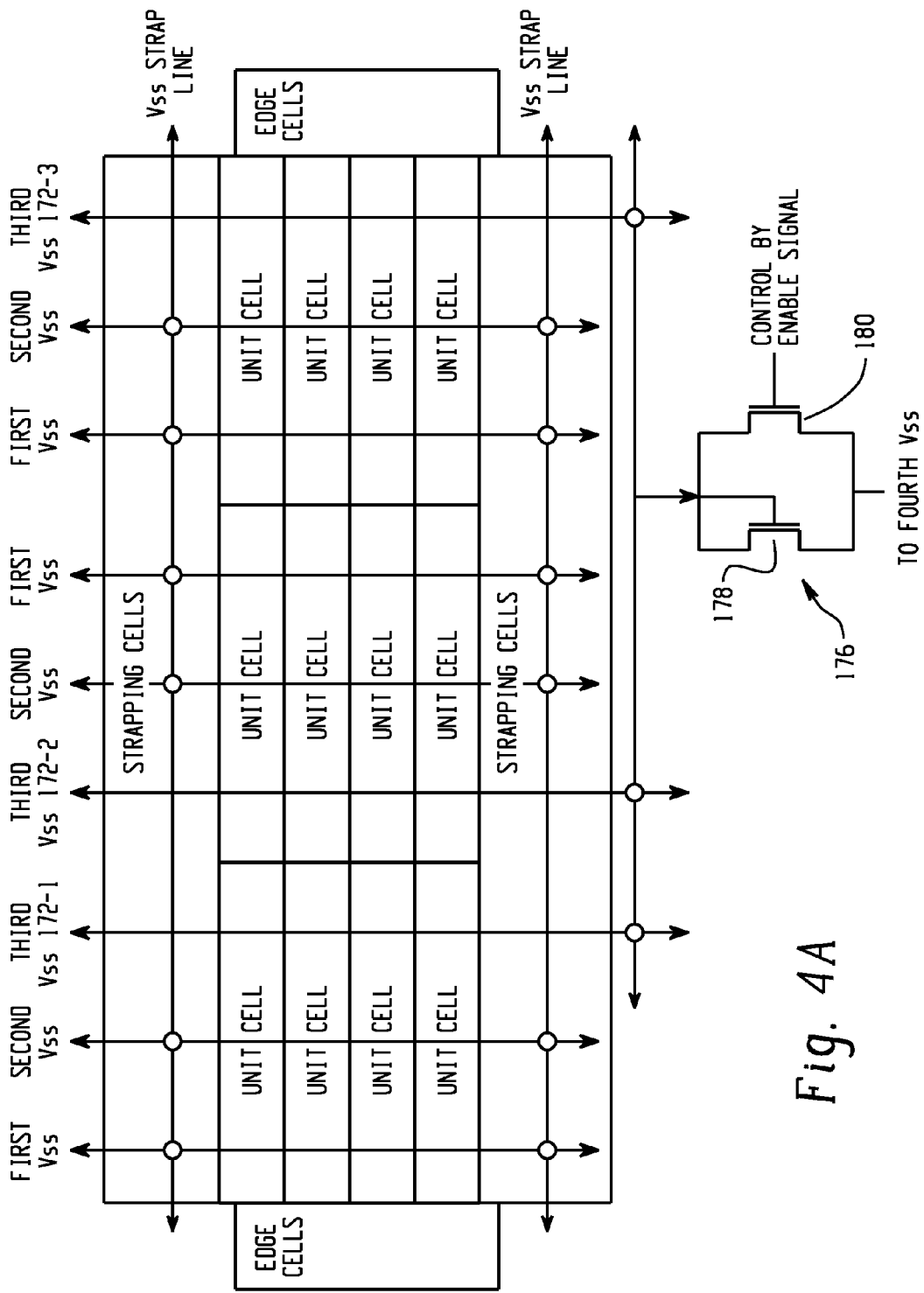
FIG. 4A is a schematic diagram illustrating another example two-port SRAM cell array metal structure.
Figure 4B:
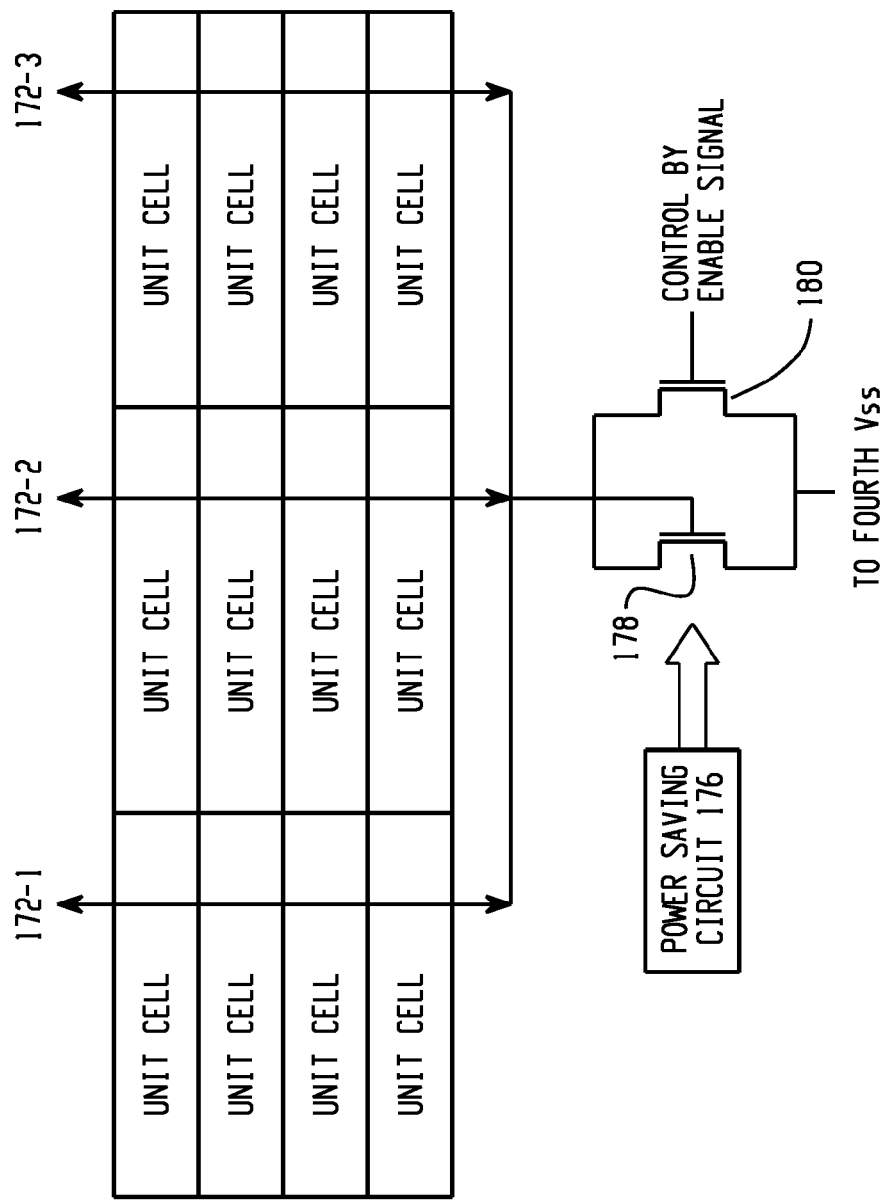
FIG. 4B is a simplified block diagram of the example system of FIG. 4A.

Depicted in FIG. 4A is a schematic diagram illustrating another example two-port SRAM cell array metal structure. Depicted in FIG. 4B is a simplified block diagram of the example system of FIG. 4A. In the example of FIGS. 4A and 4B, the third Vss line 172 has multiple segments 172-1, 172-2, and 172-3. Different groupings of unit cells that make up the memory array 166 are coupled to one of the third Vss line segments 172-1, 172-2, or 172-3. In this example, third Vss line segment 172-1 is associated with the four unit cells in the left column of FIGS. 4A and 4B, third Vss line segment 172-2 is associated with the four cells in the center column, and third Vss line segment 172-3 is associated with the four cells in the right column. Also, in this example the third Vss line segments 172-1, 172-2, and 172-3 are electrically connected together and coupled to a single power save circuit 176 that sets the voltage level on the third Vss line 172. The power save circuits function to pull down the third Vss line to a lower Vss potential when the power save circuits 176 are enabled, and to keep the voltage level at a higher Vss potential when the power save circuits are not enabled.

The power save circuit 176 is configured to provide a negative voltage pulse to the third Vss line 172 during a read cycle (e.g., when the read pass device 118 of FIG. 1 is enabled or when the read word line 136 is active) to drive the voltage on the third Vss line lower than the voltage on the first Vss line. In this example, the power save circuit 176 comprises a first NMOSFET 178 having a gate node and a drain node that are electrically connected to the third Vss line and having a source node that is electrically connected to a fourth Vss line. The power save circuit 176 further comprises a second NMOSFET 180 having a drain node that is electrically connected to the third Vss line, a source node that is electrically connected to the fourth Vss line, and a gate node that is controlled by an enable signal. In other examples, other power save circuits may be used.

Also, in this example, the metal conductors of the first Vss line 168, second Vss line 170 and third Vss line 172 are located at the same metal layer and all follow a first routing direction. The third Vss line 172 is electrically isolated from both the first Vss line 168 and the second Vss line 170.

Figure 5A:
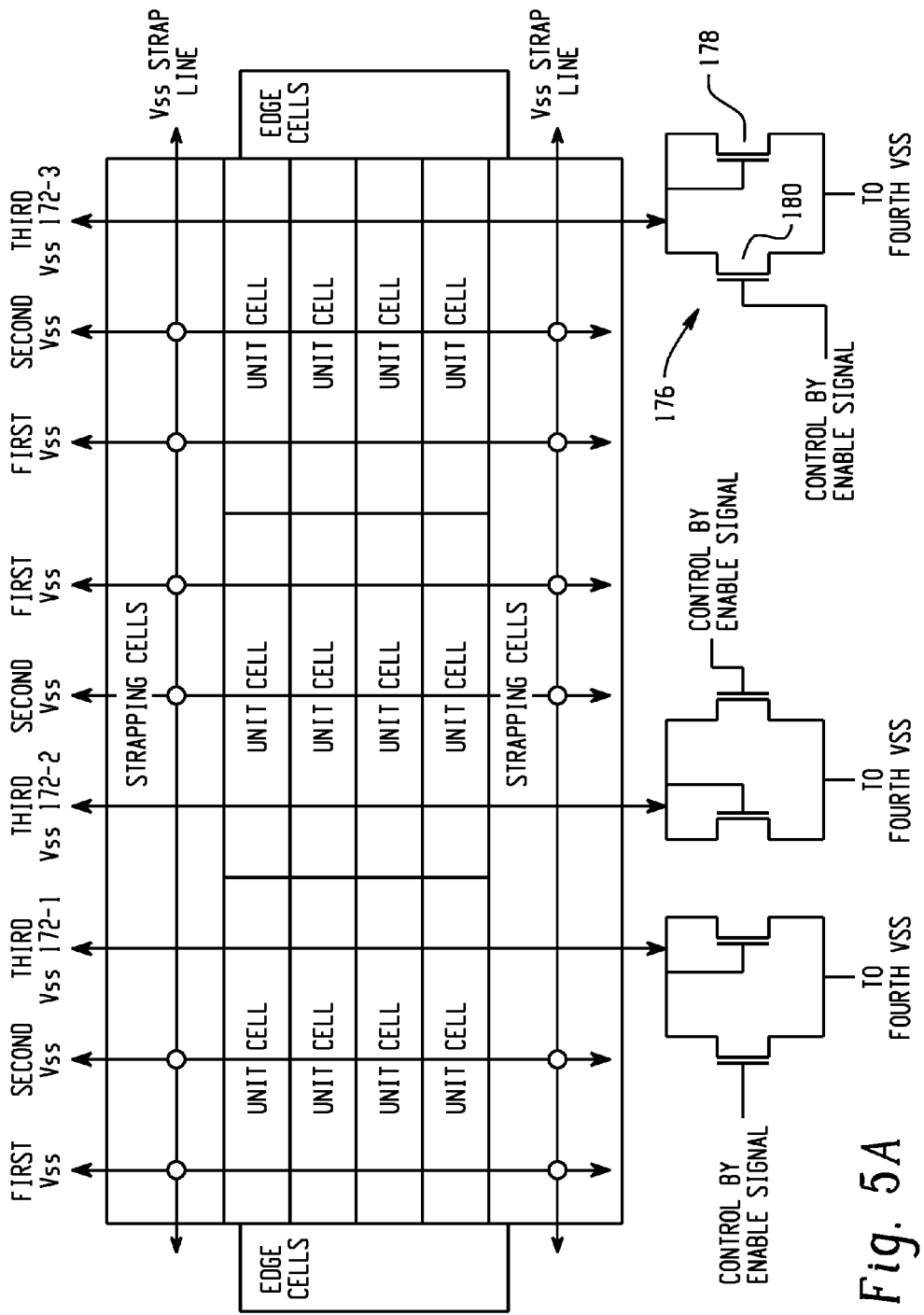
FIG. 5A is a schematic diagram illustrating another example two-port SRAM cell array metal structure.
Figure 5B:
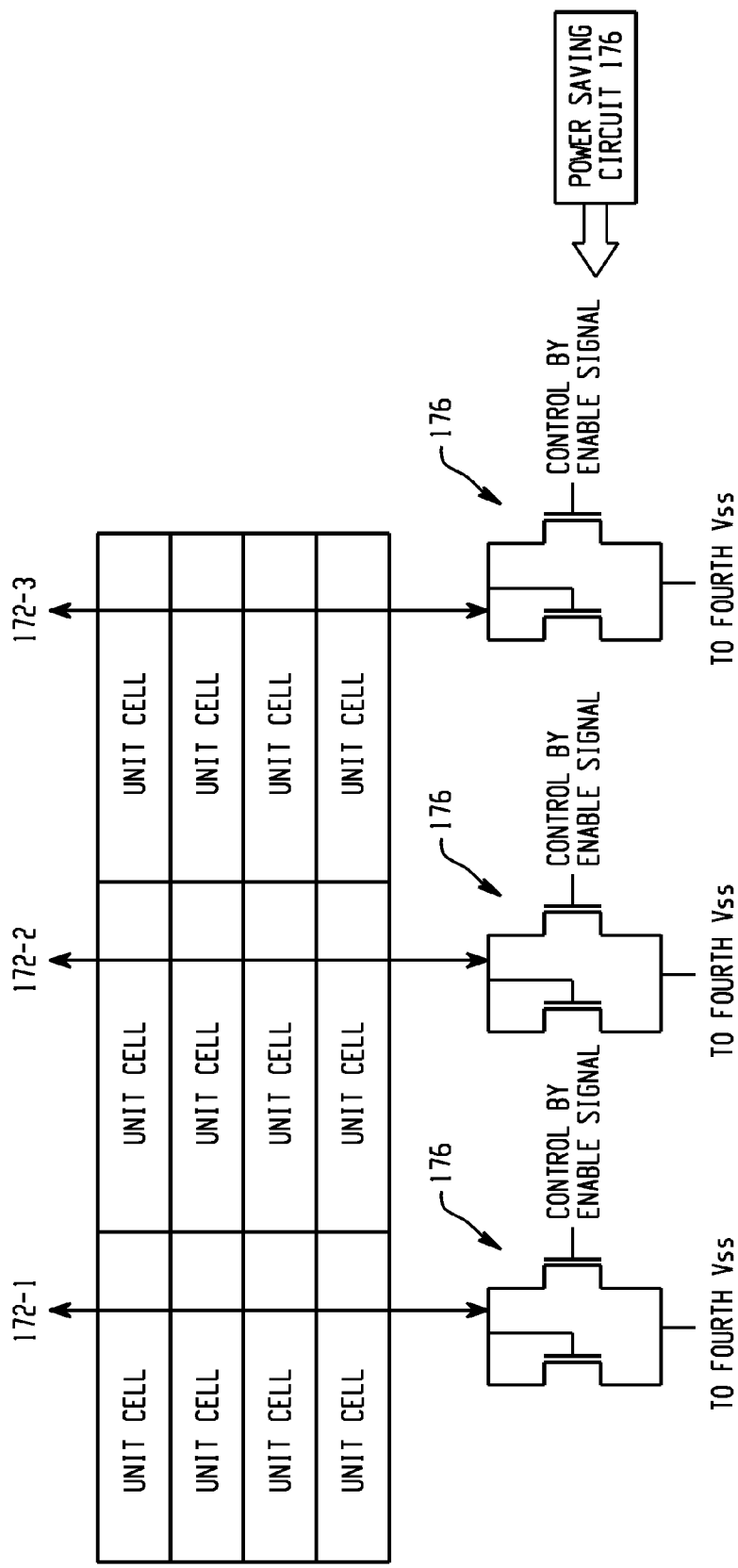
FIG. 5B is a simplified block diagram of the example system of FIG. 5A.

Depicted in FIG. 5A is a schematic diagram illustrating another example two-port SRAM cell array metal structure. Depicted in FIG. 5B is a simplified block diagram of the example system of FIG. 5A. In the example of FIGS. 5A and 5B, the third Vss line 172 has multiple segments 172-1, 172-2, and 172-3. Different groupings of unit cells that make up the memory array 166 are coupled to one of the third Vss line segments 172-1, 172-2, or 172-3. In this example, third Vss line segment 172-1 is associated with the four unit cells in the left column of FIGS. 5A and 5B, third Vss line segment 172-2 is associated with the four cells in the center column, and third Vss line segment 172-3 is associated with the four cells in the right column. Also, in this example, each third Vss line segment 172-1, 172-2 and 172-3 is connected to a unique power saving circuit 176 that sets the voltage level on its associated third Vss line segment. In this example three power save circuits 176 are utilized, one for each of the three Vss line segments 172-1, 172-2 and 172-3. The power save circuits function to pull down the third Vss line to a lower Vss potential when the power save circuits 176 are enabled, and to keep the voltage level at a higher Vss potential when the power save circuits are not enabled.

The power save circuit 176 is configured to provide a negative voltage pulse to the third Vss line 172 during a read cycle (e.g., when the read pass device 118 of FIG. 1 is enabled or when the read word line 136 is active) to drive the voltage on the third Vss line lower than the voltage on the first Vss line. In this example, the power save circuit 176 comprises a first NMOSFET 178 having a gate node and a drain node that are electrically connected to the third Vss line and having a source node that is electrically connected to a fourth Vss line. The power save circuit 176 further comprises a second NMOSFET 180 having a drain node that is electrically connected to the third Vss line, a source node that is electrically connected to the fourth Vss line, and a gate node that is controlled by an enable signal. In other examples, other power save circuits may be used.

Figure 6:
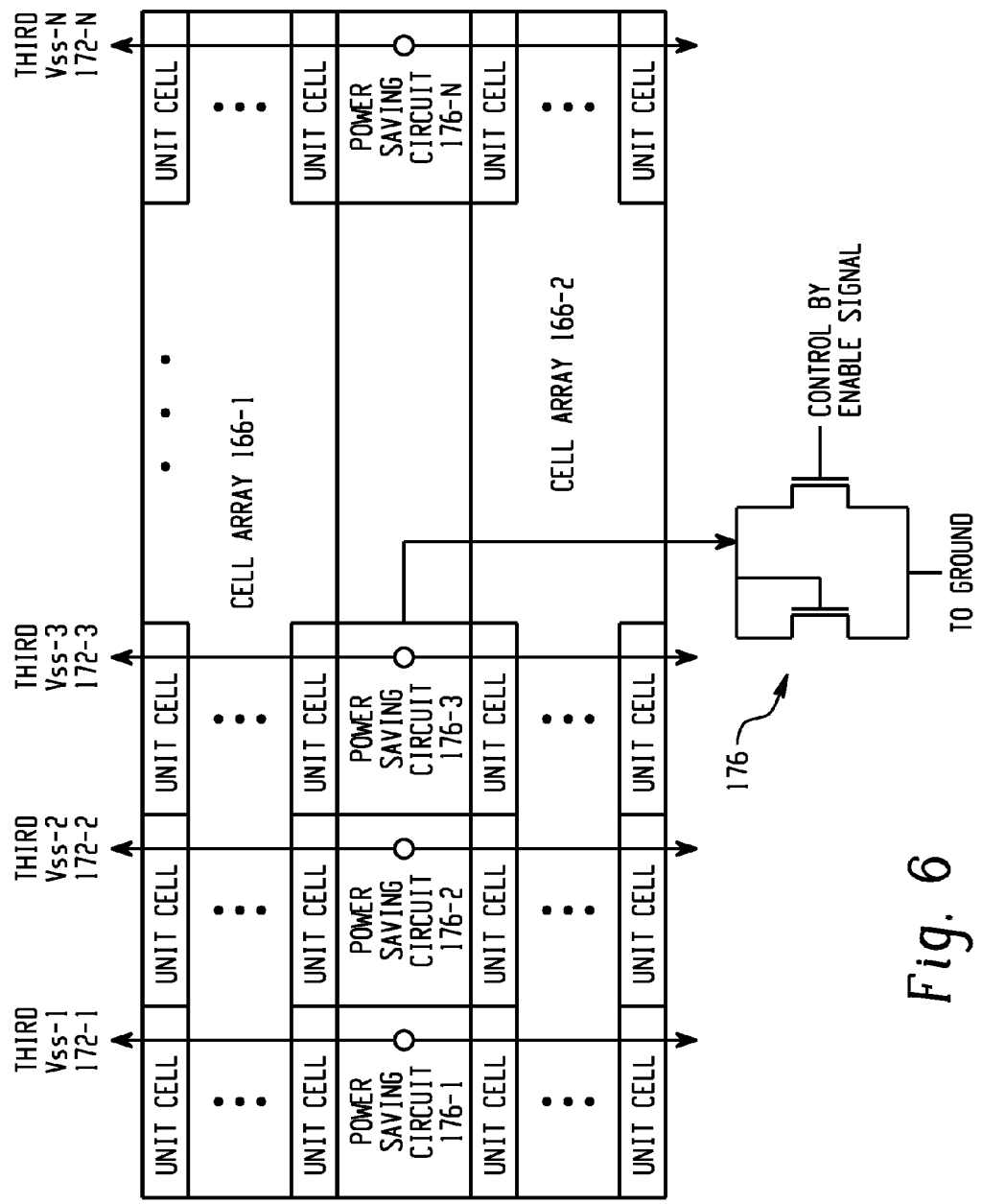
FIG. 6 is a block diagram that illustrates an example system with two cell arrays.

Depicted in FIG. 6 is a block diagram that illustrates an example system with two cell arrays 166-1 and 166-2, wherein power saving circuits 176 are shared between subsets of the cells in each of the two cell arrays 166-1 and 166-2. In this example, third Vss line segment 172-1 is associated with a subset of unit cells in cell array 166-1 and a subset of unit cells in cell array 166-2. Power saving circuit 176-1 is coupled to third Vss line segment 172-1 to control the potential level applied thereto. Similarly, third Vss line segment 172-2 is associated with a subset of unit cells in cell array 166-1 and a subset of unit cells in cell array 166-2. Power saving circuit 176-2 is coupled to third Vss line segment 172-2 to control the potential level applied thereto. This pattern repeats for the other line segments 172-N and power save circuits 176-N.

Figure 7:
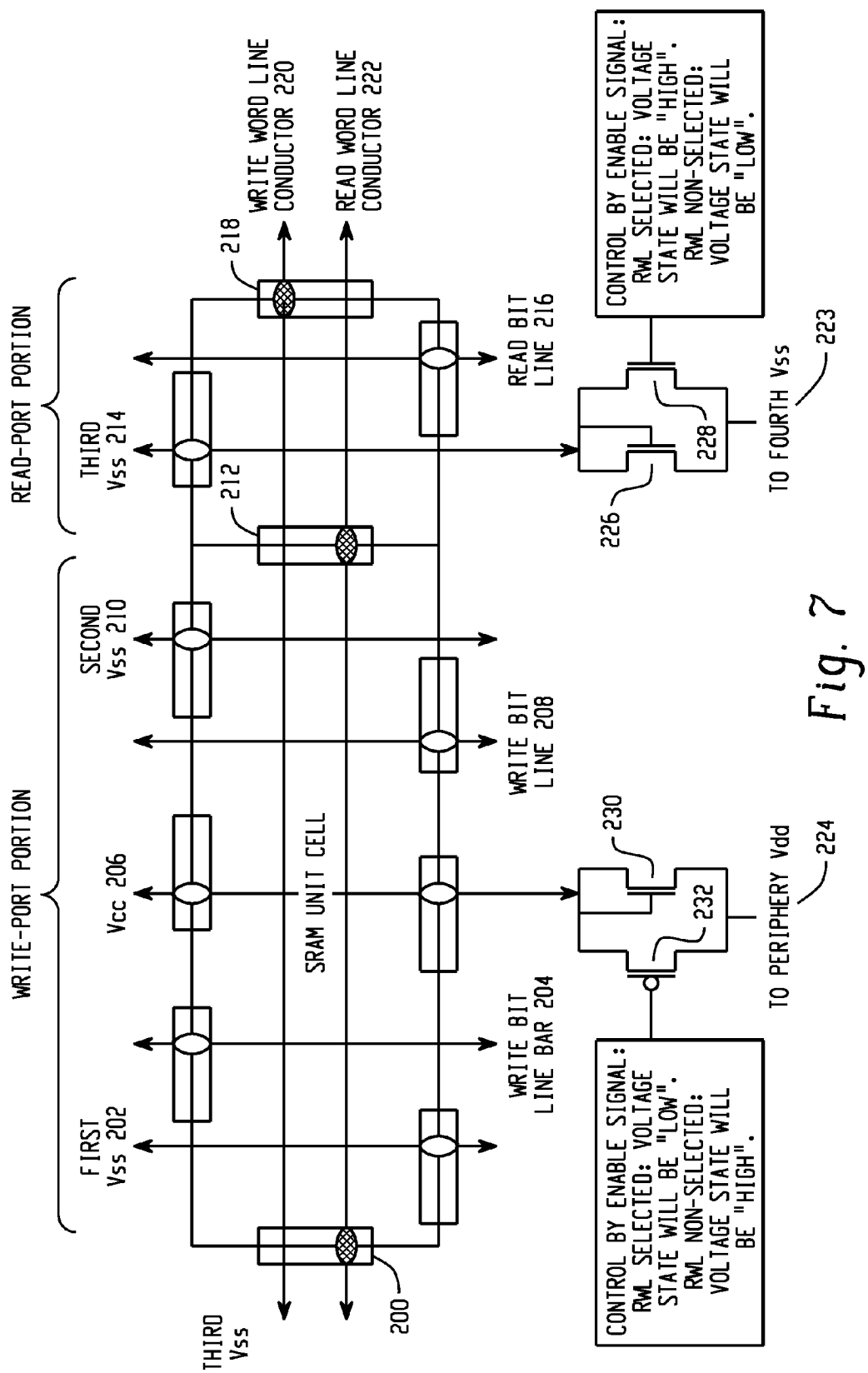
FIG. 7 is a schematic diagram illustrating another example metal structure for the example two-port SRAM unit cell.

Depicted in FIG. 7 is a schematic diagram illustrating another example metal structure for the example two-port SRAM unit cell of FIG. 1. In this example, the first-level metal layer comprises a first write-port landing pad 200, a first Vss line 202, a write bit line 204, a first Vcc line 206, a write bit line bar 208, a second Vss line 210, a second landing pad 212, a third Vss line 214, a read bit line 216 and a read-port landing pad 218. Also illustrated are second-level metal layer conductors comprising a read word line conductor 220 and a write word line conductor 222. In this example, the third Vss line 214 is coupled to a first power saving circuit 223, and the Vcc line 206 is coupled to a second power saving circuit 224. The power saving circuits 223, 224 are controlled by an enable signal that becomes active when the read word line is active. When the read word line is active, the first power saving circuit 223 is operative to connect the third Vss line 214 to a fourth Vss potential that is lower than the voltage level when the read word line is not active, and the second power saving circuit 224 is operative to connect the Vcc line 206 to a higher periphery Vdd level. When the read word line is not active, the first power saving circuit 223 is operative to apply a potential level to the third Vss line 214 that is higher than the fourth Vss potential level, and the second power saving circuit 224 is operative to connect the Vcc line 206 to a voltage level that is lower than the periphery Vdd level.

In this example, the first power save circuit 223 comprises a first NMOSFET 226 having a gate node and a drain node that are electrically connected to the third Vss line and having a source node that is electrically connected to a fourth Vss line. The power save circuit 223 further comprises a second NMOSFET 228 having a drain node that is electrically connected to the third Vss line, a source node that is electrically connected to the fourth Vss line, and a gate node that is controlled by an enable signal. In other examples, other power save circuits may be used.

The second power save circuit 224 comprises a NMOSFET 230 having a drain node that is electrically connected to a Vdd line, and a source node and a gate node that are electrically connected to the Vcc line. The second power save circuit 224 further comprises a PMOSFET 232 having a drain node that is electrically connected to the Vcc line, a source node that is electrically connected to the Vdd line, and a gate node that is controlled by the read word line signal. In other examples, other power save circuits may be used.

Figure 8:
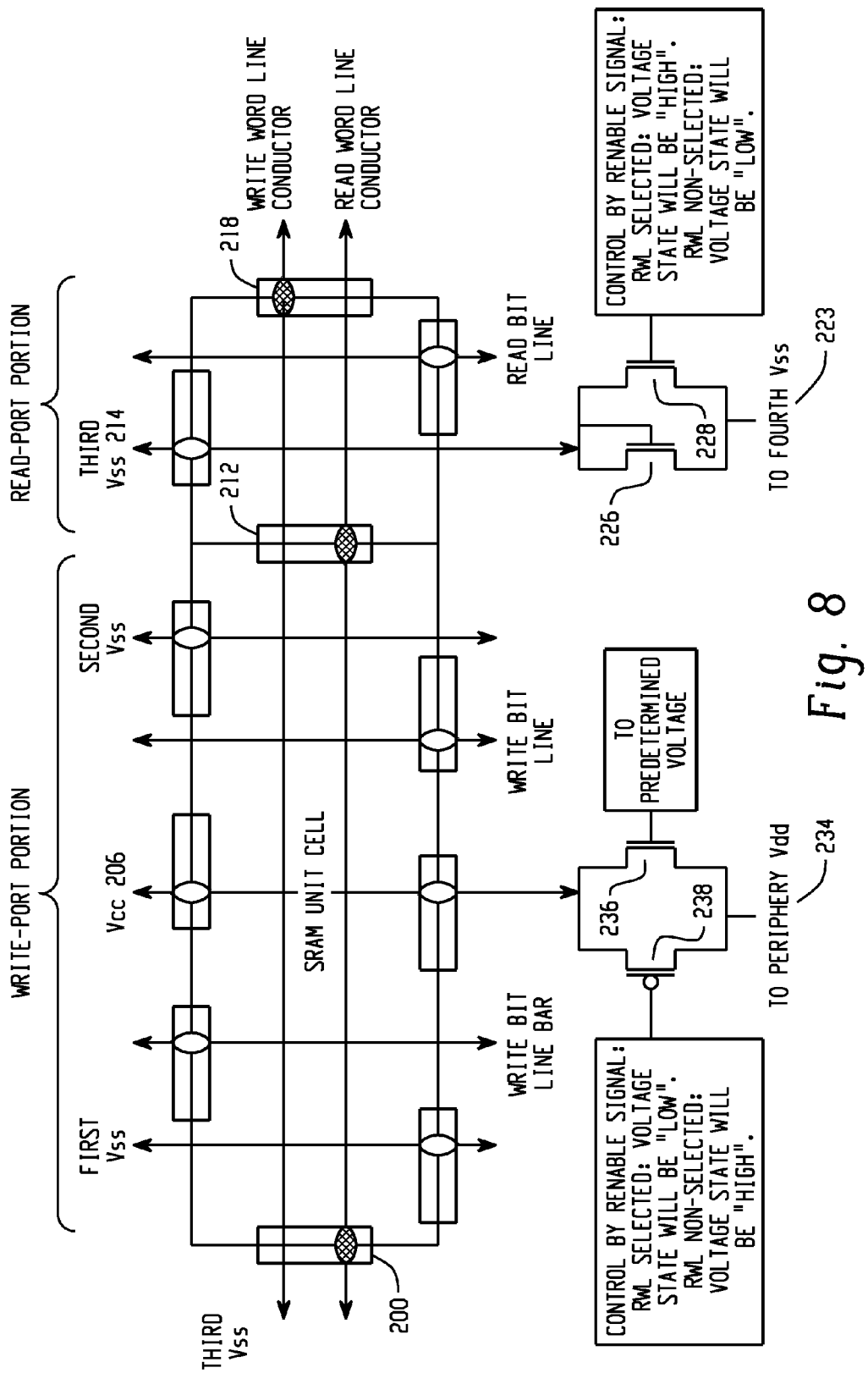
FIG. 8 is a schematic diagram illustrating another example metal structure for the example two-port SRAM unit cell.

Depicted in FIG. 8 is a schematic diagram illustrating another example metal structure for the example two-port SRAM unit cell of FIG. 1. In this example, the third Vss line 214 is coupled to a first power saving circuit 223 and the Vcc line 206 is coupled to a second power saving circuit 234. In this example, the power saving circuits 223, 234 are controlled by an enable signal that becomes active when the read word line has been selected. When the read word line is active, the first power saving circuit 223 is operative to connect the third Vss line 214 to a fourth Vss level, and the second power saving circuit 234 is operative to connect the Vcc line 206 to a periphery Vdd level. When the read word line is not active, the first power saving circuit 223 is operative to connect the third Vss line 214 to voltage level higher than the fourth Vss level, and the second power saving circuit 234 is operative to connect the Vcc line 206 to a predetermined voltage level lower than the periphery Vdd level.

In this example, the first power save circuit 223 comprises a first NMOSFET 226 having a gate node and a drain node that are electrically connected to the third Vss line 214 and having a source node that is electrically connected to a fourth Vss line. The power save circuit 223 further comprises a second NMOSFET 228 having a drain node that is electrically connected to the third Vss line 214, a source node that is electrically connected to the fourth Vss line, and a gate node that is controlled by an enable signal. In other examples, other power save circuits may be used.

The second power save circuit 234 comprises a first NMOSFET 236 having a drain node that is electrically connected to a Vdd line, a source node that is electrically connected to the Vcc line 206, and a gate node that is controlled by a predetermined voltage. The second power save circuit 234 further comprises a first PMOSFET 238 having a drain node that is electrically connected to the Vcc line 206, a source node that is electrically connected to the Vdd line, and a gate node that is controlled by a read word line signal.

Figure 9:
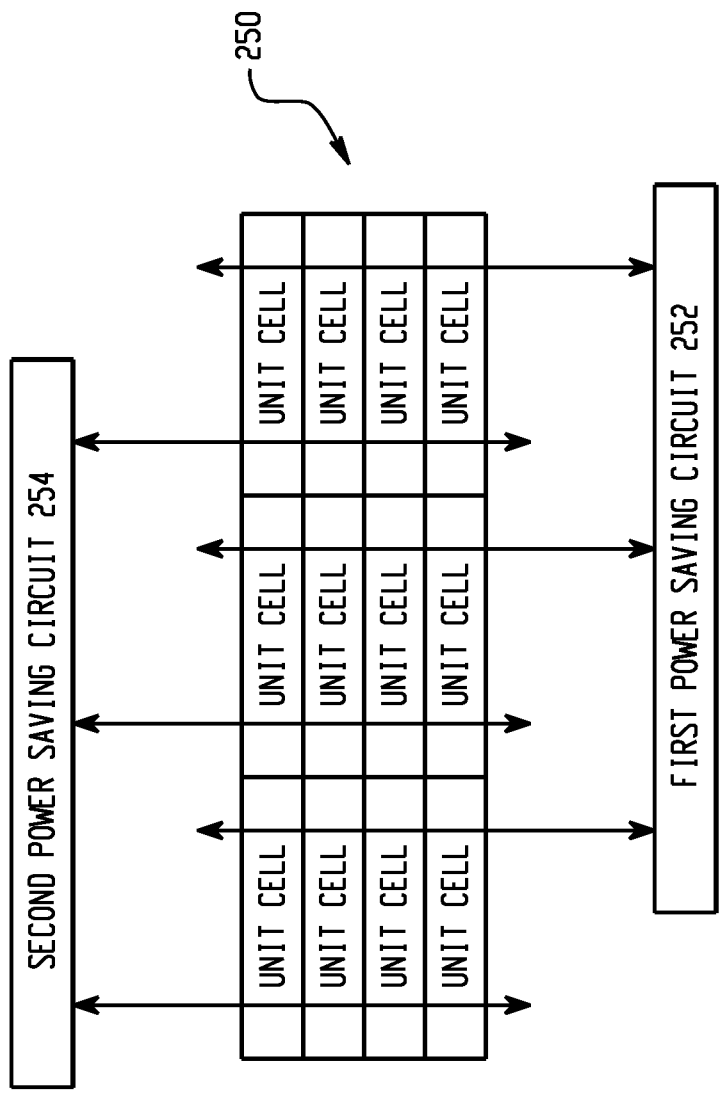
FIG. 9 is a block diagram of an example system with a first power saving circuit and a second power saving circuit.

Depicted in FIG. 9 is a block diagram that illustrates an example system wherein in a cell array 250, all third Vss lines use one common first power saving circuit 252 and all Vcc lines use a common second power saving circuit 254.

Figure 10:
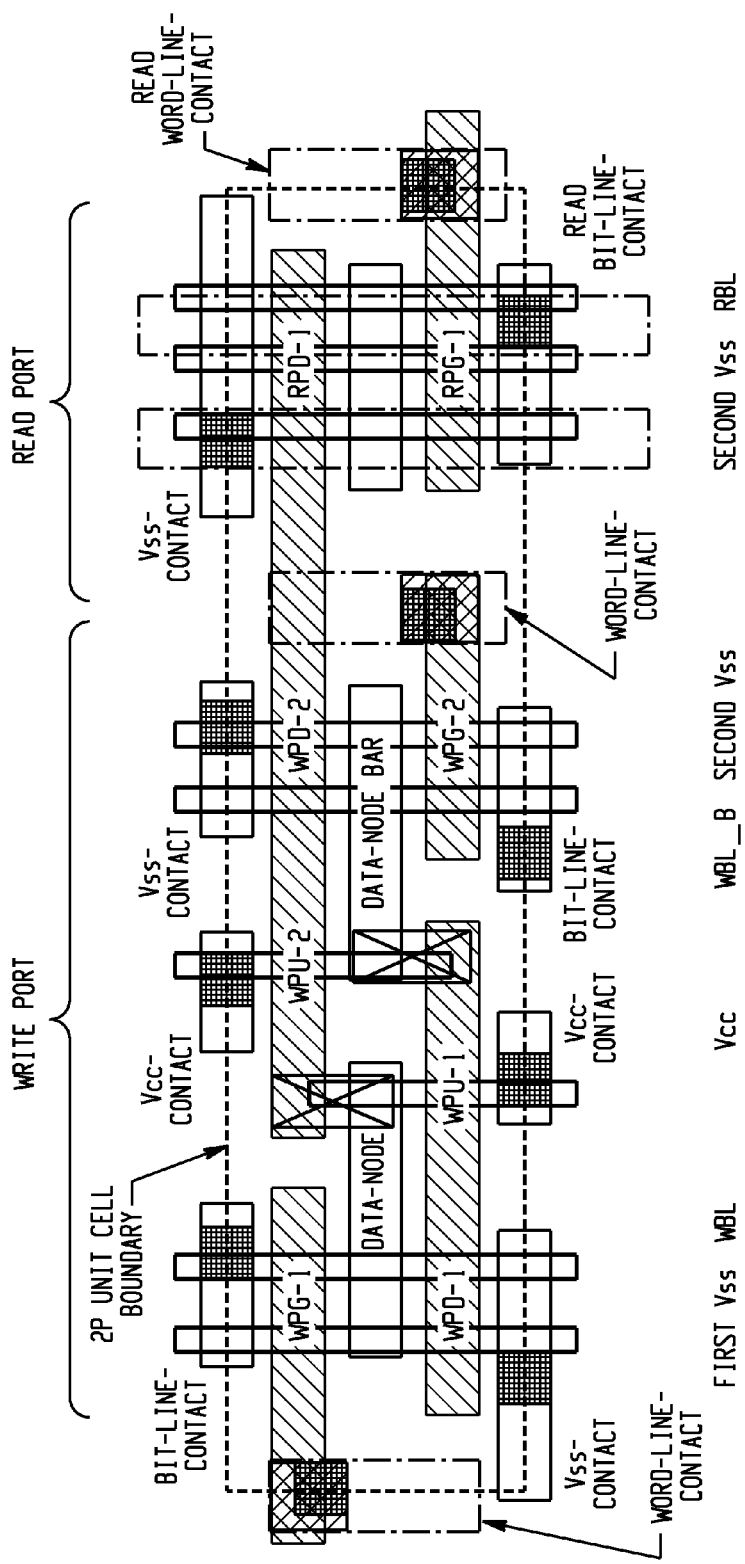
FIG. 10 block diagram that illustrates an example two-port SRAM cell and metal layout.

Depicted in FIG. 10 is a block diagram that illustrates an example two-port SRAM cell transistors setting and metal layout (OD/well/gate/contact/via1/M1). The cell devices are formed by FinFET transistors. In this example, the first pull-down (WPD-1) and second pull-down (WPD-2) devices comprise more fins than the first pull-up (WPU-1) and second pull-up (WPU-2) devices. Also, the read pull-down (RPD-1) device comprises more fins than the first pull-down (WPD-1) and second pull-down (WPD-2) devices. In this example, the first pull-up (WPU-1) and second pull-up (WPU-2) each comprises a single fin transistor, the first pull-down (WPD-1) and second pull-down (WPD-2) devices each comprises a two fin transistor, and the read pull-down (RPD-1) device comprises a more than two fin transistor.

The examples disclosed herein may be able to achieve both high speed and lower leakage through the use of a two-port cell array. The examples disclosed herein may combine both high-speed devices and lower leakage devices in memory cells.

In some examples, the two-port SRAM cell comprises different Vss lines for the read port and the write port. The read port Vss line has a higher voltage than the write port Vss line during cell non-selected cycle. In some examples, the two-port SRAM cell have devices that are sized one way for the write-port portion and sized differently for the read-port portion. In some examples, the read-port devices have more fins than the write-port devices for high speed application. Some examples include a power saving circuit that is connected the Vss line to reduce the leakage consumption that may result from a lower Vt part. The example two-port SRAM with power saving circuit can allow better optimization for leakage power (e.g., lower leakage devices for the memory cell or write-port portion), active power (lower Vcc_min during read cycle) and chip performance (high drive current for read-port).

This written description uses examples to disclose the invention, includes the best mode, and also to enable persons skilled in the art to make and use the invention. The patentable scope of the invention may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional structures may be included and/or described features may be omitted in other embodiments.

What is claimed is:

1. A semiconductor device comprising:
   a plurality of SRAM memory arrays, each memory array comprising a plurality of memory cells, each memory cell comprising a write port and a read port, each write port comprising a first pull-down device and a second pull-down device, each read port comprising a read pull-down device;
   a source terminal of the first pull-down devices coupled to a first Vss conductor line;
   a source terminal of the second pull-down devices coupled to a second Vss conductor line;
   a source terminal of the read pull-down devices coupled to a third Vss conductor line; and
   wherein the third Vss conductor line is electrically isolated from both the first Vss conductor line and the second Vss conductor line.

2. The semiconductor device according to claim 1, wherein the first Vss line has a first Vss potential, the third Vss line has a second Vss potential, and wherein the second Vss potential is higher than the first Vss potential during a non read cycle.

3. The semiconductor device according to claim 1, wherein the third Vss line has a second Vss potential during a non read cycle and a third Vss potential during a read cycle, and wherein the second Vss potential is higher than the third Vss potential.

4. The semiconductor device according to claim 1 wherein the first Vss conductor line, the second Vss conductor line, and the third Vss conductor line are located at a first metal layer, and wherein the Vss strap line is located at a second metal layer and is coupled to one or more vias to connect the first Vss conductor line and the second Vss conductor line.

5. The semiconductor device according to claim 1 wherein each memory cell further comprises a first and second pull-up device, wherein each of the first and second pull-up devices, the first and second pull-down devices, and the read port pull-down device comprises a FinFet transistor, and wherein the first and second pull-down devices have more fins than the first and second pull-up devices, and wherein the read port pull-down devices have more fins than the first and second pull-down devices.

6. The semiconductor device according to claim 5, wherein the read port pull-down devices have three fins, the first and second pull-down devices have two fins, and the first and second pull-up devices have one fin.

7. A memory cell comprising:
   a write port comprising a pair of cross-coupled inverters and a plurality of metal lines, the first inverter of the cross-coupled inverters comprising a first pull-up device and a first pull-down device, the second inverter of the cross-coupled inverters comprising a second pull-up device and a second pull-down device, the metal lines comprising a Vcc conductor line, a first Vss conductor line, and a second Vss conductor line, the first pull-down device having a source terminal coupled to the first Vss line, the second pull-down device having a source terminal coupled to the second Vss line;
   a read port comprising a cascaded device, a read word line, a read bit line and a third Vss conductor line, the cascaded device comprising a read pull-down device and a read pass device, the read pull-down device having a source terminal coupled to the third Vss conductor line, the read pass device having a drain terminal coupled to the read bit line;
   the third Vss conductor line coupled to a first power saving circuit; and
   the Vcc conductor line coupled to a second power saving circuit.

8. The memory cell of claim 7, wherein the third Vss conductor line is electrically isolated from the first Vss line and the second Vss line.

9. The memory cell of claim 7, wherein the first Vss line has a first Vss potential, the third Vss line has a second Vss potential, and the second Vss potential is higher than first Vss potential during a non read cycle.

10. The semiconductor structure according to claim 7, wherein the third Vss line has a second Vss potential during a non read cycle and a third Vss potential during a read cycle, and wherein the second Vss potential is higher than the third Vss potential.

11. The memory cell of claim 7, wherein the first power saving circuit is configured to provide a negative voltage pulse to the third Vss line during a read cycle to drive the voltage on the third Vss line lower than the voltage on the first Vss line.

12. The memory cell of claim 7, wherein the Vcc line has a first Vcc potential and a second Vcc potential that is selected by the second power saving circuit, the first Vcc potential being selected when the read word line is selected, the second Vcc potential being selected when the read word line is not selected, and wherein the first Vcc potential is higher than the second Vcc potential.

13. The memory cell of claim 7, wherein the first power saving circuit comprises:
   a first NMOSFET having a gate node and a drain node that are electrically connected to the third Vss line and having a source node that is electrically connected to a fourth Vss line; and
   a second NMOSFET having a drain node that is electrically connected to the third Vss line, a source node that is electrically connected to the fourth Vss line, and a gate node that is controlled by an enable signal.

14. The memory cell of claim 13, wherein the enable signal is configured to turn on the second NMOSFET when the read word line is selected, and wherein the enable signal is configured to turn off the second NMOSFET when the read word line is not selected.

15. The memory cell of claim 7, wherein the second power saving circuit comprises:
   a first NMOSFET having a drain node that is electrically connected to a Vdd line, a source node that is electrically connected to the Vcc line, and a gate node that is controlled by a predetermined voltage; and
   a first PMOSFET having a drain node that is electrically connected to the Vcc line, a source node that is electrically connected to the Vdd line, and a gate node that is controlled by a read word line signal.

16. The memory cell of claim 7, wherein the second power saving circuit comprises:
   a first NMOSFET having a drain node and a gate node that are electrically connected to a Vdd line, and a source node that is electrically connected to the Vcc line; and a first PMOSFET having a drain node that is electrically connected to the Vcc line, a source node that is electrically connected to the Vdd line, and a gate node that is controlled by an enable signal.

17. A static random access memory (SRAM) comprising:
a plurality of memory arrays, each memory array comprising a plurality of memory cells,
a first memory array of the plurality of memory arrays comprising a plurality of first memory cells, each first memory cell comprising a write port and a read port, each write port comprising two pass gate devices, a first pull-down device and a second pull-down device, a first pull-up device and a second pull-up device, and write port metal lines, the write port metal lines comprising a first Vcc line, a first Vss line, a second Vss line, a first write bit line, a first write bit complement line, and a first write word line, each read port comprising a read pull-down device, a read pass gate, and read port metal lines, the read port metal lines comprise a third Vss line, a read bit line and a read word line,
the metal conductors of the first Vss line, the second Vss line, and the third Vss line are located at the same metal layer and following the same routing direction;
the third Vss line is electrically isolated from the first and second Vss lines; and
the devices in the first memory cells comprise FinFET transistors, the first pull-down and second pull-down devices comprising more fins than the first pull-up and second pull-up devices, the read pull-down device comprising more fins than the first pull-down and second pull-down devices.

18. The SRAM of claim 17, wherein the first pull-up and second pull-up devices each comprises a single fin transistor, the first pull-down and second pull-down devices each comprise a two fin transistor, and the read pull-down device comprises a more than two fin transistor.

19. The SRAM of claim 17, wherein the third Vss line is connected to a power saving circuit that is configured to selectively apply a first Vss potential and a second Vss potential to the Vss line, the first Vss potential being selected when the read word line is selected, the second Vss potential being selected when the read word line is not selected, and wherein the first Vss potential is lower than the second Vss potential.

20. The SRAM of claim 17, wherein the third Vss line is connected to a power saving circuit that is configured to selectively apply a first Vss potential and a second Vss potential to the Vss line, the first Vss potential being selected when the read word line is selected, the second Vss potential being selected when the read word line is not selected, and wherein the first Vss potential is lower than the potential on the first Vss line.

* * * * *